United States Patent [19]

Wittlinger

[11] 4,251,811
[45] Feb. 17, 1981

[54] BATTERY TEST SYSTEM, AS FOR SMOKE DETECTOR ALARM

[75] Inventor: Harold A. Wittlinger, Hopewell Township, Mercer County, N.J.

[73] Assignee: RCA Corporation, New York, N.Y.

[21] Appl. No.: 106,656

[22] Filed: Dec. 26, 1979

[51] Int. Cl.³ .................. G08B 21/00; G08B 17/10
[52] U.S. Cl. .................................. 340/636; 320/48; 324/435; 340/628
[58] Field of Search ............... 340/628, 629, 630, 636; 250/381, 384, 573, 574, 575; 320/48; 324/428, 429, 430, 433, 434, 435, 436

[56] References Cited

U.S. PATENT DOCUMENTS

| | | | |
|---|---|---|---|
| 3,680,072 | 7/1972 | Charbonnier et al. | 340/636 X |
| 4,024,523 | 5/1977 | Arnold et al. | 340/636 |
| 4,083,037 | 4/1978 | Larsen | 340/636 X |
| 4,126,874 | 11/1978 | Suzuki et al. | 340/636 X |
| 4,138,664 | 2/1979 | Conforti et al. | 340/636 X |
| 4,138,670 | 2/1979 | Schneider et al. | 340/636 X |
| 4,149,162 | 4/1979 | Enemark et al. | 340/630 X |
| 4,160,246 | 7/1979 | Martin et al. | 340/636 X |
| 4,186,390 | 1/1980 | Enemark | 340/636 X |
| 4,198,627 | 4/1980 | Kakigi | 340/636 X |

OTHER PUBLICATIONS

Battery-Operated Smoke Detectors, The Need for Effective Battery Supervision by Raber et al., Fire Journal, Sep. 1978, pp. 104–108.

*Primary Examiner*—John W. Caldwell, Sr.
*Assistant Examiner*—Daniel Myer
*Attorney, Agent, or Firm*—E. M. Whitacre; P. J. Rasmussen; A. J. Jacobson

[57] ABSTRACT

A system for use in battery powered alarm equipment for self-testing such battery for a low voltage and a high series resistance condition, and particularly for use in systems which utilize a starting capacitor in combination with the battery to provide a high starting current to the alarm annunciator. For periodic battery tests, a resistor is selectively connected across the battery and the resulting voltage drop at the battery terminals is compared to a reference voltage supply. Energy stored in the starting capacitor is prevented from discharging through the battery test circuit by a transistor switch operated in the inverse mode for disconnecting the starting capacitor from one of the battery terminals during such battery tests so that substantially no current is supplied from the starting capacitor through the test circuit. When the alarm is activated, the transistor switch is operated in the normal mode to connect the starting capacitor in parallel with the battery to provide starting current for the alarm. When the alarm annunciator is not activated, the starting capacitor is maintained at substantially full battery voltage.

12 Claims, 2 Drawing Figures

BATTERY TEST SYSTEM, AS FOR SMOKE DETECTOR ALARM

This invention relates to circuits used in battery powered alarm systems for self-testing the battery power source.

Alarm devices typically monitor a physical parameter and sound an alarm if the physical parameter is beyond a predetermined limit. In particular, one type of smoke detector functions as a fire alarm by monitoring an ionization chamber which samples the air surrounding it. When the sensor indicates a level of smoke above a predetermined limit, the alarm is sounded.

Battery power used in alarm system improves reliability because the system is not dependent on the AC power lines for proper functioning. However, batteries can fail, and battery life is limited. Therefore, many smoke detectors include means for periodically testing the battery to check whether the alarm system continues to be operational.

A typical smoke detector integrated circuit performs an internal test for battery under-voltage. The battery voltage is sampled approximately once per minute, and, if the battery voltage is below a predetermined limit, the alarm is sounded by pulsing the annunciator periodically, for example, at a rate of at least once per minute. The warning pulses continue until a fresh battery is installed or until the battery can no longer function. Preferably, the battery must have sufficient remaining life to sound the warning pulses for up to seven days. In this regard, it is commonplace to use a starting capacitor connected in parallel with the battery. The capacitor stores energy by charging up to battery voltage between warning pulses and provides a high starting current to pulse the annunciator. Thus, warning pulses continue even when the battery would otherwise be too weak to sound the alarm. In addition, the use of a starting capacitor extends battery life when using an annunciator, such as a mechanical horn, which requires a high starting current as compared to the required sustaining current. The starting capacitor augments battery current initially and the battery need only provide sustaining current.

In most cases, the unloaded battery voltage is an indication of its internal resistance, or its remaining life. However, in a certain percentage of cases, batteries will fail by developing a high series resistance even though the battery has a high open circuit voltage. Then, as the battery ages, there will be a period of time ranging from several days to several months in which the battery will pass an under-voltage test but will still fail to sound a sustained alarm in the event of fire. Therefore, it is better to test the series resistance of the battery as a measure of its current supplying capability. It is known that one can assess the series resistance of a battery by connecting a test resistor across the battery terminals and noting the average drop caused by loading. The resultant voltage drop, which is a measure of the series resistance, is detected by a voltage comparator, similar to that used for the under-voltage test.

The starting capacitor poses a problem in performing the series resistance test as described above. In order not to drain the battery, the series resistance test should be carried out in a brief amount of time—e.g. about 1 millisecond. The problem is that the starting capacitor will provide a high initial current discharge through the series resistance test circuit, which will defeat the battery test function.

A prior art solution to the above problem is to decouple the test circuit from the starting capacitor by using a blocking diode in series between the test circuit and the starting capacitor. The annunciator is then connected to receive starting current from the starting capacitor directly. The blocking diode prevents the starting capacitor from discharging through the battery test circuit. However, since the diode is also in series with the annunciator, the voltage available to drive the annunciator is reduced by the forward-bias voltage drop of the diode. Therefore, the use of a blocking diode can actually interfere with proper sounding of the horn under low battery voltage conditions.

The present invention is embodied in a test system for battery powered alarm equipment, wherein switch means, responsive to logic control means, substantially prevents charge stored on the starting capacitor from being discharged through the battery test circuit. The switch means is capable of bi-directional current conduction to connect the starting capacitor to provide current in a first direction to the annunciator at least when the alarm is activated, and to connect the starting capacitor to receive charging current from the battery in a second and opposite direction at least when the alarm is not activated. During battery testing, the switch means prevents sustantial current from being discharged through the test resistor.

Figure 1:
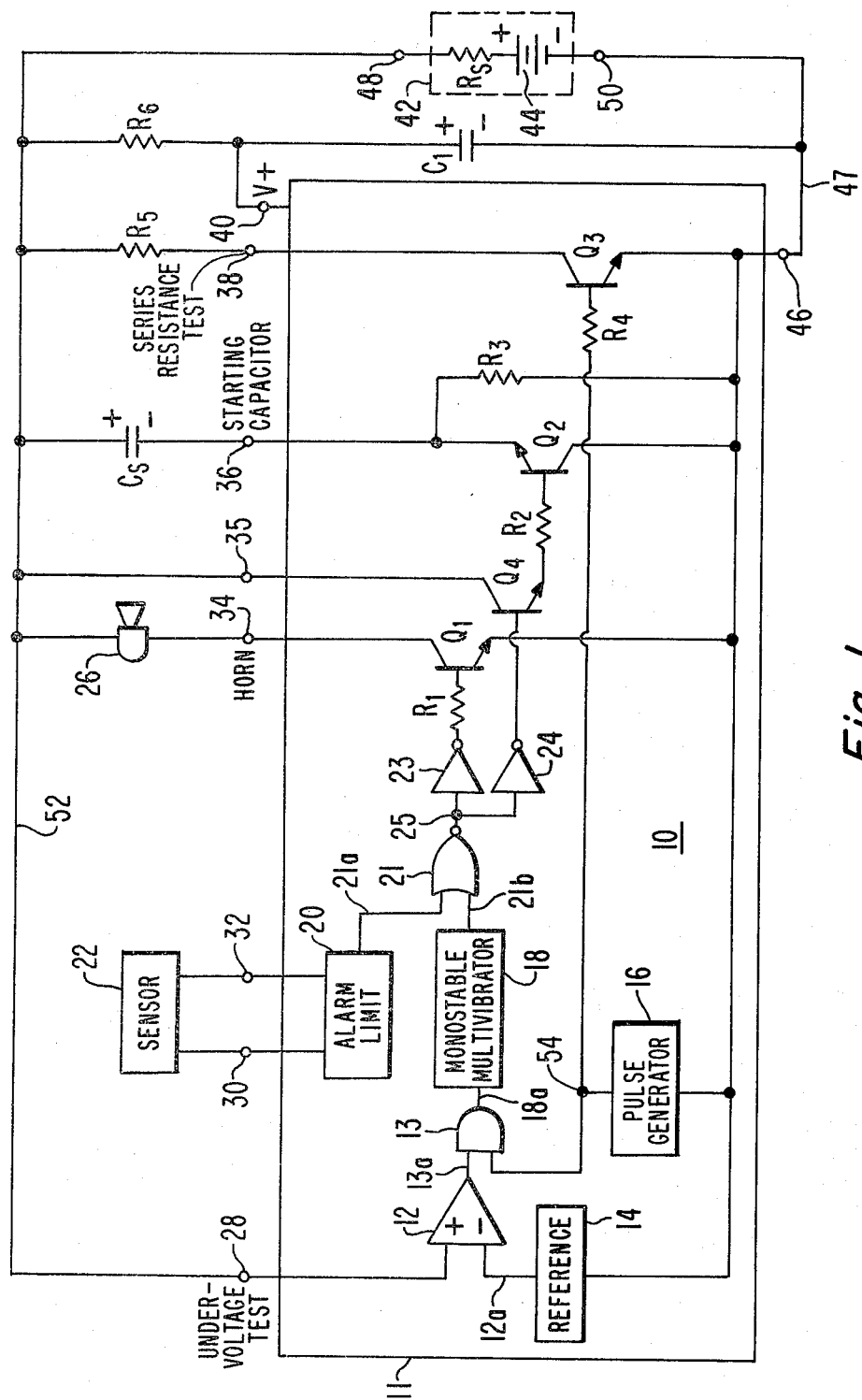
FIG. 1 is a schematic diagram, partially in block form, showing a battery-powered alarm system embodying the present invention.

FIG. 1 shows an intergrated circuit (IC) 10 in combination with other components to form a complete battery-powered alarm system. Those components inside the solid rectangular line 11 are internal to the IC 10. The external components, connected to the IC 10 at the terminals indicated, are a sensor 22 which is typically an ionization type smoke sensor, a horn 26, a starting capacitor $C_S$, a test resistor R5, a battery 42, and a decoupling network comprising resistor R6 and capacitor C1. The battery 42 is represented as an idealized voltage source 44 and a series resistance $R_S$. The series resistance $R_S$ represents the internal series resistance for the battery 42 as well as external resistance factors such as battery terminal corrosion, oxidation, and contact resistance. By way of example, the typical series resistance $R_S$ for a freshly installed 9-volt battery is somewhere between one and four ohms. The battery is connected to the alarm system at battery terminals 48 and 50. Battery voltage is distributed via voltage buses 52 and 47, respectively. The IC itself receives its energizing potential between power terminal 40 and 46. Note that terminal 40 is connected to battery terminal 48 via decoupling network R6 and C1. The purpose of such decoupling will become clear from the following detailed description.

Inside the IC 10, the normal alarm functions are performed by the alarm limit detector 20, NOR gate 21, inverter 23, resistor R1, and transistor Q1. Alarm limit 20 receives the output of sensor 22 on terminals 30 and 32. When the potential difference between terminals 30 and 32 is beyond a predetermined limit, the alarm limit comparator 20 provides indication to on conduction 21a to one input of NOR gate 21. The output of NOR gate 21 at node 25 responds to the alarm limit indication by providing a logical low to inverter 23 input. Inverter 23 output then forward biases the base emitter junction of transistor Q1, effectively connecting the horn 26 across the battery terminals. The collector current of Q1 provides drive current to sound the horn 26.

The logical low signal at node 25 also provides drive to transistor switch means Q2, R2, and Q4 via inverter 24. The purpose of transistor Q2 is to connect starting capacitor $C_S$ across the battery terminals 48 and 50 when the horn is to be activated. The detailed operation of switch means Q4 and Q2 is set forth below. For present purposes, however, it is to be noted that the switch means Q2, R2, Q4 connect the starting capacitor $C_S$ across the battery terminals at the same time that transistor Q1 connects the horn 26 across the battery terminals. Thus, when sounding or pulsing the alarm, $C_S$ provides a high starting current to activate the horn. When the horn is not to be activated, the capacitor $C_S$ is substantially disconnected from the system because transistor Q2 is then biased for nonconduction. Resistor R3, connected between the collector and emitter electrodes of Q2, provides a charging path between the battery terminal 50 and the starting capacitor $C_S$ so that $C_S$ will be substantially maintained at battery voltage when transistor Q2 is nonconductive.

The battery test function is performed using those components internal to the IC 10 comprising pulse generator 16, voltage reference 14, voltage comparator 12, AND gate 13, monostable multivibrator 18, and transistor switch means Q3, R4, in combination with external heat resistor R5. Voltage reference 14 is a reference supply providing a substantially fixed predetermined output potential on conductor 12a. Comparator 12 compares the relative value of the respective potentials on its input electrodes 12a, 12b and provides a logic 1 output indication when the potential on its positive input 12b exceeds the potential on its negative input 12a.

Monostable multivibrator 18 is a one shot multivibrator responsive to an input pulse on conductor 18a to provide an output pulse of predetermined duration on conductor 21b after the end of the input pulse. In particular, the output of multivibrator 18 is normally at logic 0 level. A transition on input conduction 18a from a logic 1 level to a logic 0 level will trigger multivibrator 18, thereby generating a logic 1 level output pulse on conductor 21b for about 30 milliseconds.

Pulse generator 16 provides substantially periodic output pulses at node 54. Specifically, the output of pulse generator 16 at node 54, which is normally at logic 0 level, goes to a logic 1 level for one millisecond and then returns to logic 0. Pulses are generated at a rate of one per minute.

Each output pulse from pulse generator 16 is used to perform a series resistance test. The basic series resistance test is accomplished by periodically connecting test resistor R5 across the battery terminals (via switch means Q3) and sensing the resultant drop in battery terminal voltage (at terminal 28). If the battery voltage drops below a predetermined value, a subsequent warning pulse is generated to pulse the horn.

Battery series resistance is tested during each output pulse from pulse generator 16 as follows: A logic 1 level from generator 16 on node 54 forward biases the base-emitter junction of transistor Q3 via resistor R4, connecting test resistor R5 across the battery terminals. A test current pulse is therefore drawn from the battery through resistor R5 and series resistance $R_S$. Note that transistor Q2 is normally nonconductive at this time so that $C_S$ does not discharge substantial current through R5. The reduced battery voltage on bus 52 during the test current pulse is monitored on terminal 28 by comparator 12. If the battery terminal voltage falls below that of the voltage reference 14 (corresponding to a battery fail condition), the output of comparator 12 on conductor 13a goes to a logic 1 level. At this time, the test pulse signal on node 54 is still at a logic 1 level. Therefore the output of AND gate 13 on conductor 18a goes to a logic 1 level. At the end of the test pulse signal, AND gate 13 output on conductor 18a goes from a logic 1 back to a logic 0 level, triggering multivibrator 18. The resulting 30 millisecond output pulse from multivibrator 18 is input to NOR gate 21 on conductor 21b, which results in a 30 millisecond warning pulse from multibibrator 18 to sound the horn 26. Multivibrator 18 is used so that a uniform warning pulse is produced after the battery test current pulse. Such delay is necessary because during the battery test current pulse, the battery is loaded down and the horn cannot be sounded.

After the end of the warning pulse, capacitor $C_S$ begins charging up via resistor R3 towards the unloaded battery voltage. Resistor R3 must be small enough so that $C_S$ can be recharged between one-minute pulses from pulse generator 16. On the other hand, R3 must be large enough compared to $R_S$ so that $C_S$ does not discharge substantial current through R5 during the test current pulse.

It will be appreciated that the series resistance test as described, is actually a test of both open circuit voltage and series resistance. The test voltage on voltage bus 52 during test loading is equal to the open circuit voltage less the voltage drop across the series resistor $R_S$. Since the test voltage must be larger than a predetermined reference voltage, the battery test is actually a combination of both open circuit voltage and internal series resistance.

One skilled in the electronic arts will be able to select component values so that a desired combination of series resistance and open circuit voltage will cause the system to begin sounding warning pulses. For example, assume that the voltage reference 14 is set just a few tenths of a volt below the minimum acceptable battery voltage. Then a low level test current pulse, on the order of tens of milliamperes, is drawn during the battery test pulse signal to produce a voltage drop at the battery terminals. The low level test does not actually draw a current which can sound the horn. However, if the low level test is passed, it can be shown that $R_S$ is low enough so that the battery is still able to supply current required to drive the horn.

Alternatively, where battery series resistance is not independent of battery current, it may be desired to draw high level test current pulses on the same order of magnitude as the current required for the horn. In such cases, test current pulses up to hundreds of milliamperes may be drawn. The test load resistor R5 is then made equal to the horn impedance and the reference voltage 14 is set equal to the minimum horn voltage. Although higher test current pulses tend to consume more battery power as compared to lower level test current pulses, there is an improved level of confidence that, if the test is passed, the battery can sound the horn.

Decoupling network R6 and C1 form a low pass filter for decoupling the test current pulse from the IC itself. Energy stored on the capacitor C1 provides an energizing potential for the IC while the test circuit loads the battery down. Capacitor C1 is recharged between test pulses via resistor R6.

Figure 2:
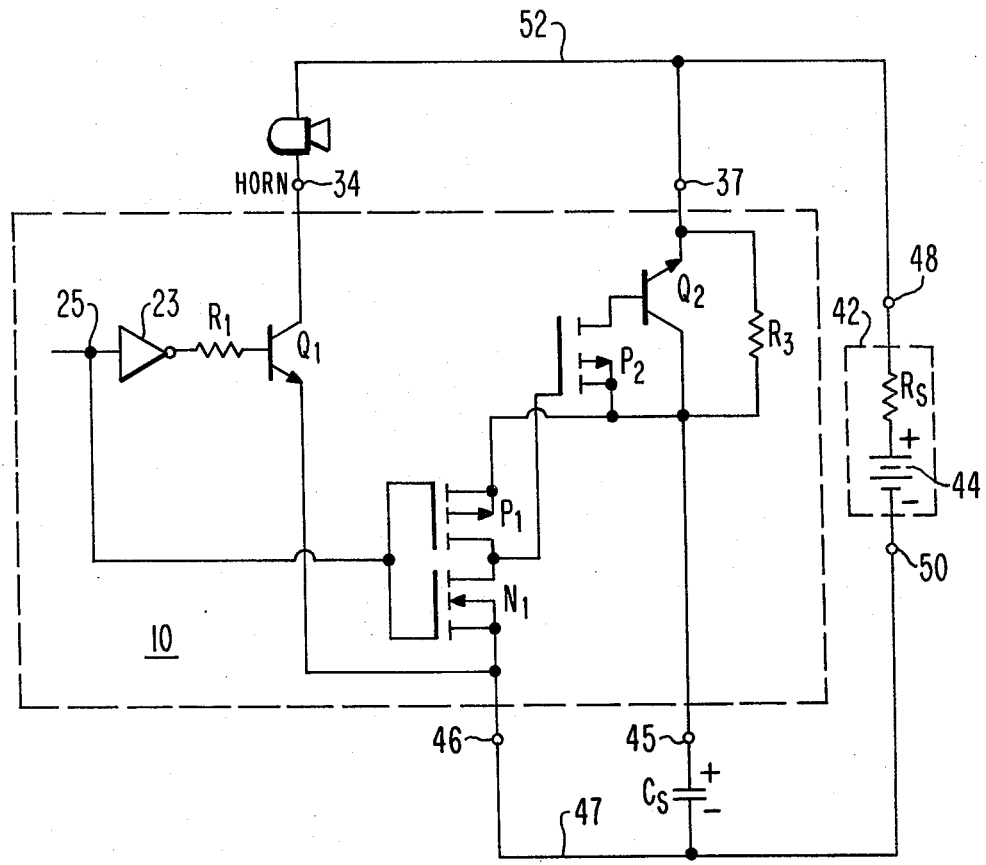
FIG. 2 is an alternate embodiment of the switch means for the system shown in FIG. 1.

The switch means Q2 in FIGS. 1 and 2 is capable of carrying a bi-directional current. When $C_S$ is being charged up to battery voltage, current flow is from voltage bus 52 to terminal 46 and voltage bus 47. When $C_S$ is supplying starting current, the direction of current flow is reversed.

To appreciate the consequences of bi-directional current flow through the switch means, assume $C_S$ is fully charged. When Q2 turns on, $C_S$ discharges producing a current through Q2 from collector to emitter, the collector of Q2 being at a higher potential relative to the emitter. This is the normal mode of operation for an NPN transistor.

However, when Q2 switches off, $C_S$ now charges back up to battery voltage via R3. Now the emitter of Q2 is at a higher potential than the collector and cutoff. Therefore, Q2 is operated in an inverse mode.

Generally a transistor has three semiconductor regions. The emitter, base, and collector (or the source, gate, and drain) electrodes of the transistor are ordinarily defined in terms of the operating potentials applied thereto. Naturally, in a completely symmetrical device, emitter and collector electrodes are interchangeable. However, particularly for an asymmetrical transistor device as used herein, emitter, base, and collector electrodes are defined in terms of their geometric relationship. The middle semiconductor region is always defined as the base. The other two regions form respective PN junction areas with the base region. The region forming the relatively larger junction area with the base is defined as the collector; and the region forming the relatively smaller junction area is defined as the emitter.

Interchanging collector and emitter electrodes results in an inverse mode of operation, which is often undesirable. For instance, in an asymmetrical device, the emitter and collector can be interchanged, but its operating characteristics, particularly beta, will be adversely affected. Also, in certain bipolar processes, a vertical transistor structure has a parasitic diode between the collector and the substrate which prevents the transistor from being operated in an inverse mode with the collector potential less than the substrate potential. Partly for the former reason, Q2 is arranged so that it is operated in normal mode (for high beta) when connecting $C_S$ to terminal 46, and in inverse mode when disconnecting $C_S$ from terminal 46. Partly for the latter reason, the collector of Q2 is returned to a circuit node which does not go below substrate potential when $C_S$ discharges. Note that the emitter of Q2 in FIG. 1 does go below substrate potential when $C_S$ discharges.

Transistor Q2 is switched by emitter follower Q4. To turn Q2 on, Q4 is driven into conduction by inverter 24, which for example can be a complementary symmetry, metal oxide semiconductor (CMOS) inverter. A high output from inverter 24 provides a diode connection for Q4. Base current for Q2 and Q4 is provided by $C_S$ to forward bias the base-emitter junctions of both Q2 and Q4. Resistor R2 limits the base current drive. Emitter current from Q2 discharges $C_S$ thereby providing starting current for the horn 26.

To turn Q2 off, Q4 is cut off by a low potential output from inverter 24. The base of Q2 is therefore open, and Q2 is rendered nonconductive.

An alternate embodiment of a switch means is shown in FIG. 2. Here, the principal conduction current path of transistor Q2 is connected between $C_S$ and the positive voltage bus 52. Inverter 24 from FIG. 1 is represented in FIG. 2 as a pair of complementary field effect transistors comprising P-channel enhancement type transistor P1 and N-channel enhancement type transistor N1. Transistors P1 and N1 are arranged as a conventional CMOS inverter having the source electrode of N1 returned to the most negative potential at terminal 46, and wherein the source electrode of P1 is connected to the more positive potential on starting capacitor $C_S$. Therefore, energy stored on capacitor $C_S$ provides the operating potential for CMOS inverter P1, N1. The output of the inverter P1, N1, at the interconnection of their drain electrodes, is connected to the gate electrode of enhancement type P-channel field effect transistor P2. The conduction channel of P2 is connected between the base and collector electrodes of Q2.

Transistors P1, N1, P2, and Q2 are responsive to first and second states of the control signal at node 25 to respectively connect or disconnect capacitor $C_S$ from terminal 37. When the signal at node 25 is at a high potential so as to condition N1 for conduction, the gate and source electrodes of P2 are connected via N1 to terminals 46 and 45 respectively. Note how capacitor $C_S$ is also connected between terminals 46 and 45. Assuming that $C_S$ has been previously charged up to battery voltage via R3, the gate to source potential provided by $C_S$ will condition P2 for conduction. When P2 is conductive, the base and collector electrodes of Q2 are connected together. Transistor Q2 is now a forward biased, diode-connected transistor conducting a direction so as to connect $C_S$ to terminal 37. When the signal at node 25 is at a low potential so as to condition P1 for conduction, the gate and source electrodes of P2 are connected together via the conduction channel of P1. Therefore P2 is conditioned for nonconduction, rendering the base of Q2 open, and Q2 nonconductive.

In other words, transistor P2 acts as a switch means alternatively connecting or disconnecting the base and collector electrodes of Q2. When conditioned for conduction, Q2 is actually diode-connected in such direction so as to discharge $C_S$ through the horn 26, but when conditioned for nonconduction, the base of Q2 is essentially left open-circuited. As before, Q2 is operated in normal mode to connect $C_S$ to terminal 37 and in inverse mode to essentially disconnect $C_S$ therefrom. The principal current conduction path between drain and source electrodes of P2 alone might alternatively be used to connect or disconnect $C_S$ from terminal 37, assuming that sufficient area for the required transistor channel were available on the integrated circuit.

NOR gate 13, as described above, functions as a logic control means which connects $C_S$ to the horn during the time the horn is to be activated, and effectively disconnects $C_S$ at all other times. Alternatively, the logic control means can be arranged, for example, to effectively disconnect $C_S$ during the test current pulse and connect $C_S$ at all other times. The important point is that $C_S$ be connected at least when the horn is to be activated, and effectively disconnected at least during the current test pulse.

Various substitutions of circuit elements and system components are possible. The annunciator horn, for example, may be a piezoelectric type, or the smoke sensor may be a photoelectric type. Furthermore, the principles set forth herein apply to any battery operated system, particularly those using a starting capacitor to augment current from the battery, wherein an automatic test of the system battery is desired.

What is claimed is:

1. In a battery powered alarm circuit having first and second battery terminals for receiving a battery potential therebetween, a sensor for detecting an alarm condition, means responsive to said sensor for providing an alarm control signal, an annunciator responsive to said alarm control signal for sounding an alarm, and a capacitor for providing starting current for said annunciator, a test system for determining a high series resistance condition of said battery, said test system comprising:
   means for drawing a test current pulse from said battery, said means having a test pulse signal indicating said test current pulse;
   switch means having a principal current conduction path, and a control electrode, the potential on said control electrode determining the conductivity of said principal current conduction path, said switch means having its principal current conduction path connected in series with said starting capacitor;
   logic control means responsive to said alarm control signal and said test pulse signal, said logic control means having an output terminal connected to the control electrode of said switch means for conditioning said switch means for conduction at least during said alarm control signal, and for conditioning said switch means for nonconduction at least during said test pulse signal, so that said starting capacitor does not discharge substantial current during said test current pulse; and
   test means responsive to said test current pulse for indicating a high series resistance condition of said battery.

2. A battery test system according to claim 1 wherein said means for drawing a test current pulse comprises:
   a first resistor;
   pulse generator means for supplying said test pulse signal; and
   means responsive to said test pulse signal for selectively connecting said resistor across said first and second battery terminals.

3. A battery test system according to claim 2 further comprising:
   a second resistor connected across the principal current conduction path of said switch means, said second resistor being of a value so that said starting capacitor does not discharge substantial current through said first resistor during said test pulse signal.

4. A battery test system according to claim 1 wherein said test means comprises:
   voltage comparator means connected between said first and second battery terminals for providing indication when the potential between said first and second battery terminals is below a predetermined value.

5. A battery test system according to claim 4 wherein said voltage comparator means provides said indication when the potential between said first and second battery terminals is less than a prescribed minium battery voltage, and
   said first resistor is of a value so that during said pulse test current pulse the voltage across said resistor is equal to said prescribed minium battery voltage condition when said battery series resistance is equal to the maximum acceptable high series resistance condition for said battery.

6. A battery test system according to claim 1 wherein said switch means comprises:
   a first transistor having first and second electrodes defining the ends of its principal current conduction path, and having a third electrode for controlling the current through its principal current conduction path, said first transistor having its principal current conduction path connected between said starting capacitor and said first battery terminal;
   a second transistor having first and second electrodes defining the ends of a principal current conduction path, and having a third electrode, the potential between the first and third electrodes controlling the current through its principal current conduction path;
   means for connecting the third electrode of the first transistor to the first electrode of the second transistor;
   means for connecting the second electrode of the second transistor to said second battery terminal; and
   means for connecting said third electrode of said second transistor to said output terminal of said logic control means.

7. A switch means according to claim 6 wherein said means for connecting the second electrode of the second transistor to said second battery terminal consists of a direct connection without substantial intervening impedance.

8. A switch means according to claim 6 wherein said means for connecting the third electrode of the first transistor to the first electrode of the second transistor comprises a third resistor.

9. A battery test system according to claim 1 wherein said switch means comprises:
   a first transistor of a first conductivity type having first and second electrodes defining the ends of its principal current conduction path, and having a third electrode for controlling the current through its principal current conduction path, said first transistor having its principal current conduction path connected in series between said starting capacitor and said second battery terminal; and
   means connected to said output terminal of said logic control means, for connecting said third electrode to said second electrode of said first transistor responsive to a first state of the signal from said output terminal of said logic control means, and for substantially disconnecting said third electrode from said second electrode of said first transistor, responsive to a second state of the signal from said output terminal of said logic control means.

10. A battery test system according to claim 9 wherein said means for connecting said third electrode to said second electrode of said first transistor comprises:
   a first field effect transistor of said first conductivity type, having source, drain, and gate electrodes, the drain electrode thereof being connected to the third electrode of said first transistor, the source electrode thereof being connected to the second electrode of said first transistor;
   a second field effect transistor of said first conductivity type;
   a third field effect transistor of a second conductivity type opposite to said first conductivity type;
   means for connecting the gate electrode of the first field effect transistor to the respective drain electrodes of said second and third field effect transistors;

means for connecting the source electrode of said first field effect transistor to the source electrode of said second field effect transistors;

means for connecting the source electrode of the third transistor to said first battery terminal; and means for connecting the respective gate electrodes of said second and third field effect transistors to said output terminal of said logic control means.

11. A battery test system according to claims 6 or 9 further comprising:

a second resistor connected across the principal current conduction path of said first transistor, said second resistor being of a value so that said starting capacitor does not discharge substantial current through said resistor during said test pulse signal.

12. A battery test system according to claim 1, wherein said alarm circuit further includes first and second power terminals for receiving an energizing potential therebetween, means for decoupling said test current pulse from said first and second power terminals, said decoupling means comprising:

a second capacitor connected between said first and second power terminals; and a fourth resistor connected between said second power terminal and said second battery terminal.

* * * * *